(12) United States Patent
Karthaus

(10) Patent No.: US 8,928,519 B2
(45) Date of Patent: Jan. 6, 2015

(54) BASED-BAND TO RADIO FREQUENCY UP-CONVERTER

(71) Applicant: Kathrein-Werke KG, Rosenheim (DE)

(72) Inventor: Udo Karthaus, Neu-Ulm (DE)

(73) Assignee: Kathrein-Werke KG, Rosenheim (DE)

( * ) Notice: Subject to any disclaimer, the term of this patent is extended or adjusted under 35 U.S.C. 154(b) by 0 days.

(21) Appl. No.: 14/076,492

(22) Filed: Nov. 11, 2013

(65) Prior Publication Data

US 2014/0125505 A1 May 8, 2014

Related U.S. Application Data

(63) Continuation-in-part of application No. PCT/EP2012/058725, filed on May 11, 2012, which is a continuation of application No. 13/105,097, filed on May 11, 2011, now abandoned.

(51) Int. Cl.
*H04L 17/02* (2006.01)
*H03M 3/00* (2006.01)

(52) U.S. Cl.
CPC ............ *H03M 3/30* (2013.01); *H03M 3/508* (2013.01)
USPC ........... 341/173; 341/143; 341/174; 341/180; 341/185

(58) Field of Classification Search
CPC .............. H04L 2027/0018; H04L 27/361; H04L 27/2067; H04L 27/0014; H04L 5/0007; H04L 2027/003; H04L 27/2017; H04L 27/2627; H04L 27/34; H04L 1/0002; H04L 2027/0057; H04L 27/2626; H04B 1/0483; H04B 2001/0491; H04B 1/406; H04B 1/005; H04B 1/16

USPC .................. 455/103, 118, 130; 375/295, 307; 341/173, 174
See application file for complete search history.

(56) References Cited

U.S. PATENT DOCUMENTS 6,175,746 B1 * 1/2001 Nakayama et al. ......... 455/552.1
6,278,391 B1 * 8/2001 Walker .......................... 341/118
(Continued)

FOREIGN PATENT DOCUMENTS

| EP | 2044784 | 4/2009 |
|----|---------|--------|
| GB | 2440192 | 1/2008 |
| WO | 2008/009421 | 1/2008 |

OTHER PUBLICATIONS

Subhan et al, "D/A Resolution Impact on a Poly-phase Multipath Transmitter", Proceedings Prorisc, 2008.

(Continued)

*Primary Examiner* — Linh Nguyen
(74) *Attorney, Agent, or Firm* — Stephen H. Eland; Dann, Dorfman, Herrell & Skillman

(57) ABSTRACT

A base band to frequency up-converter is described wherein the base band to frequency up-converter comprises a first input for receiving a first base band signal of first base band samples and a second input for receiving a second base band signal of second base band samples and an output for providing up-converted radio signal samples. The base-band to radio frequency up-converter further comprises a phase converter for converting the first base band signal of first base band samples and the second base band signal of second base band samples into a first intermediate signal of first intermediate samples, a second intermediate signal of second intermediate samples, and a third intermediate signal of third intermediate samples. The intermediate samples are then up-converted into radio signal samples.

13 Claims, 3 Drawing Sheets

(56) References Cited

U.S. PATENT DOCUMENTS

| | | | |
|---|---|---|---|
| 6,477,477 B1* | 11/2002 | Thron et al. | 702/86 |
| 6,594,324 B1* | 7/2003 | Watanabe et al. | 375/343 |
| 7,072,422 B2* | 7/2006 | Dotsch et al. | 375/302 |
| 7,406,134 B1* | 7/2008 | Esposito | 375/308 |
| 7,515,651 B1* | 4/2009 | Haddadin et al. | 375/308 |
| 8,063,747 B2* | 11/2011 | Drucker | 340/10.4 |
| 2004/0036638 A1 | 2/2004 | Lipka | |
| 2004/0038652 A1* | 2/2004 | Khlat et al. | 455/130 |
| 2004/0192229 A1 | 9/2004 | Morris et al. | |
| 2005/0265481 A1 | 12/2005 | Bellaouar et al. | |
| 2008/0020721 A9* | 1/2008 | Morris et al. | 455/103 |
| 2009/0135920 A1* | 5/2009 | Oga | 375/242 |
| 2011/0285471 A1* | 11/2011 | Vromans et al. | 332/103 |
| 2012/0051407 A1 | 3/2012 | Ji et al. | |

OTHER PUBLICATIONS

Domanin et al, "A Multipath Polyphase Digital-To-Analog Converter for Software Radio Transmission Systems", International Symposium on Circuits & Systems, May 2000.

International Preliminary Report issued in PCT/EP12/58725 on Nov. 21, 2013.

* cited by examiner

BASED-BAND TO RADIO FREQUENCY UP-CONVERTER

CROSS-REFERENCE TO RELATED APPLICATIONS

This application is a continuation-in-part of International Patent Application No. PCT/EP2012/058725 filed on 11 May 2012 and claiming benefit of and priority to U.S. patent application Ser. No. 13/105,097 "Base-Band to Radio Frequency Up-Converter" filed on 11 May 2011. The entire disclosure of each of the foregoing applications is hereby incorporated herein by reference.

FIELD OF THE INVENTION

This field of the present application relates in general to a base-band to radio frequency up-converter and to an active antenna arrangement comprising at least the base-band to radio frequency up-converter. The field of the application also relates to a method of manufacturing a chipset with the base-band to radio frequency up-converter and a computer program product for manufacturing the base-band to radio frequency up-converter.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price and also wish to reduce the running costs of the base station. Active antenna arrangements with digital up-conversion have proven to meet these goals.

From EP 2 044 784 a digital transceiver is known that provides base-band to radio frequency up-conversion that operates in 4:3 operating mode (4:3 mode). The term "4:3 mode" in this context means that the sampling rate $f_{sampling}$ is 4/3 of the radio frequency carrier signal $f_{Carrier}$.

A data signal is applied as a single bit stream to a digital analogue converter (DAC). The data signal may be input at rates of 2.5 Gbps. The incoming signal is first decoded, buffered, and de-multiplexed into an I-signal and a Q-signal by a deserialize decoder, frame buffer and de-multiplexer block. The de-multiplexed and separated I-signal and Q-signal are further transferred separately as 16-bit word length signals to over-sampling by sample-and-hold plus FIR low-pass filter units. The oversampled I-signal and the oversampled Q-signal are further passed from the over-sampling by sample-and-hold plus FIR low-pass filter units to systolic sigma-delta low-pass modulators. The I-signal and the Q-signal are applied to a quadrature modulation by multiplexing and cyclic negation block in which the I-signal and the Q-signal are over-sampled by 1:2, cyclically negated and 2:1 multiplexed to a single 2-bit output signal applied to a power digital to analogue converter.

The known digital transceiver from EP '784 receives the data signal from a remote radio unit via an interface according to the CPRI or OBSAI standard. The members of the Open Base Station Architecture Initiative (OBSAI) have specified a complete set of interface, hardware and test specifications covering the areas of transport, clock/control, radio and base band, together with hardware connection specifications. Similarly the goal of CPRI is to allow base stations manufacturers and component vendors to share a common protocol and more easily adapt platforms from one customer to another customer. Unlike the OBSAI standard, the CPRI standard does not specify mechanical or electrical interface requirements. However, both the OBSAI standard and the CPRI standard have in common that the data that base band information for the modulation of the radio signal is included in the serial data stream as in-phase (I) and quadrature (Q) samples.

The 4:3 mode compared to a 4:1 mode enables the use of lower clock frequencies for the delta-sigma modulator and a possible use of a switch mode power amplifier. However, as the output signal of the base band to radio frequency up converter in 4:3 mode is a return to opposite code, power amplifiers used in the transmitters have to be adapted to be compatible for the 4:3 mode.

SUMMARY OF THE INVENTION

It is an aspect of the teachings of the present disclosure to provide a base-band to radio frequency up-converter comprising a first input for receiving a first base band signal of first base band samples and a second input for receiving a second base band signal of second base band samples and an output for providing up-converted radio signal samples. The base-band to radio frequency up-converter further comprises a phase converter for converting the first base band signal of first base band samples and the second base band signal of second base band samples into a first intermediate signal of first intermediate samples, a second intermediate signal of second intermediate samples, and a third intermediate signal of third intermediate samples. The base-band to radio frequency up-converter further comprises at least one delta sigma modulator for converting the first intermediate signal of first intermediate samples, the second intermediate signal of second intermediate samples, and the third intermediate signal of third intermediate samples into the radio samples.

The known base-band to radio frequency up-converters provide for each pair of in-phase sample (I) and quadrature sample (Q) four output samples: The original I-sample and the original Q-sample and the I-sample with inverted sign, and the Q-sample with inverted sign (+I, +Q, −I, −Q). This limits the ratio of sample rate to frequency of the carrier signal to a few numbers of practical modes such as 4:1, 4:3 or 4:5. The phase converter of the present disclosure provides for each pair of in-phase sample and quadrature sample three output samples. That gives the opportunity for alternative modes, such as a 3:1 or 6:1 modes.

Another aspect of the present disclosure is that the phase converter of the base-band to radio frequency up-converter provides the first intermediate samples, the second intermediate samples, and the third intermediate samples as substantially equidistant subsamples of the first base band signal and the second base band signal i.e. the first intermediate samples, the second intermediate samples and the third intermediate samples are apart 120° from each other.

The subsamples are derived from the cosine part of the first base-band signal and the sinus part of the second base-band signal. Assuming that the first intermediate sample is calculated for an angle $\alpha$, the first intermediate sample is calculated ideally as the product of $\cos(\alpha)$ times the first base-band sample and $\sin(\alpha)$ times the second base-band signal. The second intermediate sample is calculated as the product of $\cos(\alpha+120°)$ times the first base-band sample and $\sin(\alpha+120°)$ times the second base-band signal. The third intermediate sample is calculated as the product of $\cos(\alpha+240°)$ times the first base-band sample and $\sin(\alpha+240°)$ times the second base-band signal. As long as the intermediate samples are substantially equidistant the phase angle α can be chosen arbitrarily.

Another aspect of the present disclosure is that the first intermediate samples correspond substantially to the first base band signal; the second intermediate samples correspond substantially to the product of cos(120°) times the first base band sample and sin(120°) times the second base band sample the third intermediate samples corresponds substantially to the product of cos(240°) times the first base band signal and sin(240°) times the second base band signal. In this aspect of the present disclosure the above-mentioned phase angle α is chosen to be zero. This renders the calculation of the first intermediate sample very simple. As cos(0°) is 1, 0 . . . and sinus(0°) is 0, 0 . . . the first intermediate sample is identical with the first base-band sample.

Another aspect of the present disclosure is to pass at least one of the first intermediate samples, the second intermediate samples, and the third intermediate samples of the phase converter to a mode extension switch for modifying the value of at least one of the first intermediate samples, the second intermediate samples, and the third intermediate samples.

In another aspect of the present disclosure the mode extension switch alternatively inverts the value of one of the first intermediate samples, the second intermediate samples, and the third intermediate samples. This can be achieved for example by multipliers that multiply alternatively the samples with the value of +1 and −1. With a very simple mathematical operation an up-converter suitable for 3:1 mode can be turned into an up-converter for 6:1 mode. As in 6:1 mode the clock frequency is doubled in comparison to 3:1 mode, the delta-sigma modulator in 6:1 mode provides a wider delta-sigma modulator noise notch and consequently a higher bandwidth.

A higher clock frequency of the delta-sigma modulators enables in general a wider bandwidth than for lower clocked delta-sigma modulators. In real world applications the maximum clock frequency is limited by the technology and the costs of using a particular technology. Therefore for relatively low radio frequencies for example the 6:1 mode may be feasible, whereas for higher radio frequencies only a 3:1 mode may be chosen.

Another aspect of the present disclosure is that the first intermediate samples, the second intermediate samples, and the third intermediate samples of the phase converter are passed to a multiplexer for multiplexing into at least one multiplexed signal that is passed to the at least one delta sigma modulator. By multiplexing the first intermediate samples, the second intermediate samples, and the third intermediate samples of the phase converter a single delta-sigma modulator is sufficient to generate the radio signal samples.

Another aspect of the present disclosure is that the first signal of intermediate samples is passed to first delta sigma modulator, the second intermediate signal of second intermediate samples is passed to a second delta sigma modulator, and the third intermediate signal of third intermediate samples is passed to a third sigma delta modulator. With three separate delta sigma modulators the clock frequency of each of the first delta sigma modulator, the second delta sigma modulator, and the third sigma delta modulator can be chosen only a third of the frequency that has to be chosen for a single delta sigma modulator of the other aspect of the disclosure. In one aspect of the present disclosure this allows operating the first delta-sigma modulator, the second delta-sigma modulator, and the third delta-sigma modulator at the clock frequency of the carrier signal.

In another aspect of the present disclosure in connection with the mode extension switch at least two of the first modified samples, the second modified samples, and the third modified samples are passed to a multiplexer for interleaving at least two of the first modified samples, the second modified samples, and the third modified samples into the radio signal samples. In connection with the mode extension switch this aspect enables for example a 6:1 mode with three parallel delta-sigma modulators, each of the first, the second delta-sigma modulator, and the third delta-sigma modulator being clocked at two times the carrier frequency.

Another aspect of the present disclosure is that base-band to radio frequency up-converter further comprises a mode switch for switching between a first clock frequency and at least a second clock frequency supplied to the at least one first delta-sigma modulator and for switching between a first signal modifying sequence and at least a second signal modifying sequence supplied to the mode extension switch for modifying the first intermediate samples, the second intermediate samples, and the third intermediate samples of the phase converter. The mode extension switch enables the switching of the delta-sigma modulator at least between two modes, for example between 3:1 mode and 6:1 mode. This enables the use of one chip or chipset respectively for at least two different modes.

The first modifying sequence may be chosen as described above as a sequence of alternating values of +1, −1, +1, −1, . . . which is used for multiplying the first intermediate samples, the second intermediate samples, and the third intermediate samples. This first modifying sequence together with a first clock frequency of twice the carrier frequency for up-converters with parallel delta sigma modulators would set the up-converter into 6:1 mode. Choosing for the second signal modifying sequence a constant sequence of +1, +1, +1, +1, . . . that is applied for multiplying the first intermediate samples, the second intermediate samples, and the third intermediate samples obviously leaves the first intermediate samples, the second intermediate samples, and the third intermediate samples unchanged. Using at the same time for an up-converter with parallel delta-sigma modulators a clock frequency equal to the carrier frequency will switch the up-converter into 3:1 mode. For up-converters with a single delta-sigma modulator the first clock frequency would be six times the carrier frequency and the second clock frequency would be three times the carrier frequency respectively.

In another aspect of the present disclosure the phase converter is enabled to by-pass the first base band signal and the second base band signal. This bypassing may be achieved by use of switches to pass the first base band signal from the first phase converter input directly to the first phase converter output, and to pass the second phase converter input directly to the second phase converter output. Alternatively parameters used to convert the first phase converter input signal and to convert the second phase converter input signal may be set to values 1.000 and 0.000 respectively so that the values of the first phase converter input signal is passed through the converter to the first converter output without any changes and the second phase converter input signal is also passed through the signal converter to the second phase converter output without changes. This means that the first intermediate samples correspond exactly to the first baseband signal and the second intermediate samples correspond exactly to the second base band signal. In this through-pass mode the third converter output is not used. With by-passing or through-passing without changes the first base band signal and the second base band signal the base-band to radio frequency up-converter can be switched into commonly known modes, such as the 4:1 mode or the 4:3 mode. The person skilled in the art will readily appreciate that the multiplexer has to be adapted accordingly to use only two out of the three delta-sigma modulators output signals.

In another aspect of the present disclosure one of the first base band signal and second base band signal or the first intermediate samples, the second intermediate samples and the third intermediate samples are up-sampled. With this aspect of the present disclosure the symbol rate of an input signal can be adapted to the carrier frequency of a radio signal.

Another aspect of the present disclosure is a method for up-converting a first base band signal of first base band samples and a second base band signal of second base band samples into radio signal samples. The method comprises a phase conversion of the first base band signal of first base band samples and the second base band signal of second base band samples into a first intermediate signal of first intermediate samples, a second intermediate signal of second intermediate samples, and a third intermediate signal of third intermediate sample for converting the first intermediate signal of first intermediate samples, the second intermediate signal of second intermediate samples, and the third intermediate signal of third intermediate samples into the radio signal samples.

Another aspect of the teaching of this application is that the presented up-converter is incorporated in a chip set comprising a base band to frequency up-converter.

Depending on the logical concept of the chip manufacturer and technical requirements the presented up-converter may be incorporated in a single chip or spread out over at least two chips. Therefore the term "chip set" in the context of this disclosure also includes a single chip. The base band to frequency up-converter of the chip set comprises a first input for receiving a first base band signal of first base band samples and a second input for receiving a second base band signal of second base band samples and an output for providing up-converted radio signal samples. The base-band to radio frequency up-converter further comprises a phase converter for converting the first base band signal of first base band samples and the second base band signal of second base band samples into a first intermediate signal of first intermediate samples, a second intermediate signal of second intermediate samples, and a third intermediate signal of third intermediate samples at least one delta sigma modulator for converting the first intermediate signal of first intermediate samples, the second intermediate signal of second intermediate samples, and the third intermediate signal of third intermediate samples into the radio signal samples.

In another aspect of the present disclosure an active antenna array comprises a base band to frequency up-converter. The base band to frequency up-converter comprises a first input for receiving a first base band signal of first base band samples and a second input for receiving a second base band signal of second base band samples and an output for providing up-converted radio signal samples. The base-band to radio frequency up-converter further comprises a phase converter for converting the first base band signal of first base band samples and the second base band signal of second base band samples into a first intermediate signal of first intermediate samples, a second intermediate signal of second intermediate samples, and a third intermediate signal of third intermediate samples at least one delta sigma modulator for converting the first intermediate signal of first intermediate samples, the second intermediate signal of second intermediate samples, and the third intermediate signal of third intermediate samples into the radio signal samples.

It is another aspect of the present disclosure to provide a method for manufacturing a base band to frequency up-converter, which comprises a first input for receiving a first base band signal of first base band samples and a second input for receiving a second base band signal of second base band samples and an output for providing up-converted radio signal samples. The base-band to radio frequency up-converter further comprises a phase converter for converting the first base band signal of first base band samples and the second base band signal of second base band samples into a first intermediate signal of first intermediate samples, a second intermediate signal of second intermediate samples, and a third intermediate signal of third intermediate samples at least one delta sigma modulator for converting the first intermediate signal of first intermediate samples, the second intermediate signal of second intermediate samples, and the third intermediate signal of third intermediate samples into the radio signal samples Another aspect of the present disclosure is a computer program product comprising a non-transitory computer-usable medium having control logic stored therein for causing a computer to manufacture a base band to frequency up-converter, the base band to frequency up-converter comprising a first input for receiving a first base band signal of first base band samples and a second input for receiving a second base band signal of second base band samples and an output for providing up-converted radio signal samples, the base-band to radio frequency up-converter further comprising a phase converter for converting the first base band signal of first base band samples and the second base band signal of second base band samples into a first intermediate signal of first intermediate samples, a second intermediate signal of second intermediate samples, and a third intermediate signal of third intermediate sample at least one delta sigma modulator for converting the first intermediate signal of first intermediate samples, the second intermediate signal of second intermediate samples, and the third intermediate signal of third intermediate samples into the radio signal samples.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
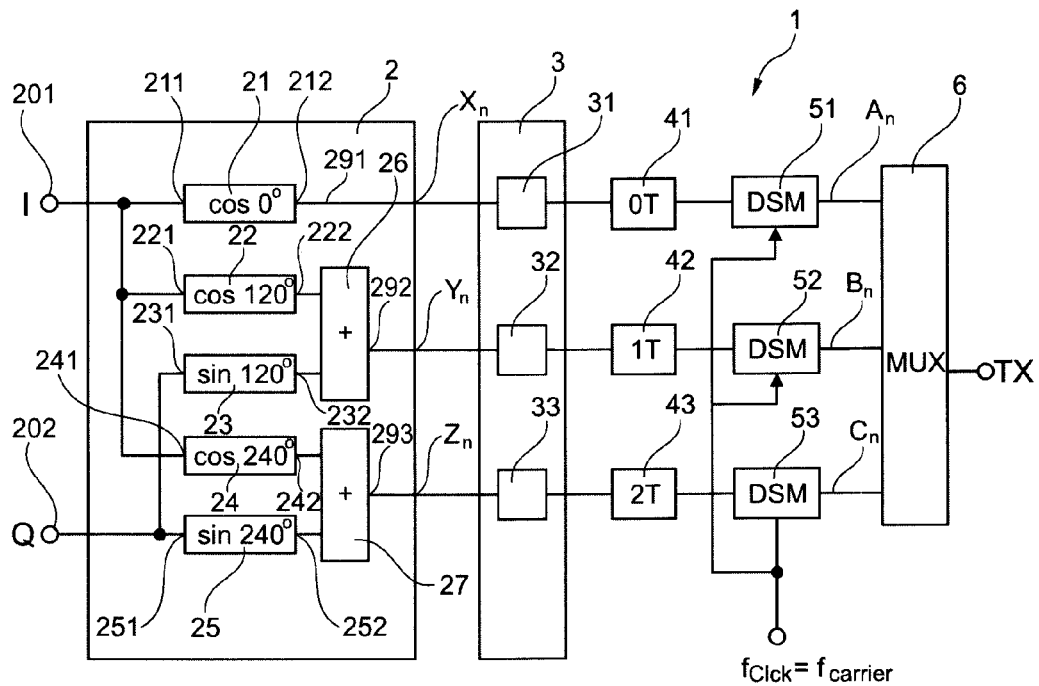
FIG. 1 shows a first aspect of the base-band to radio frequency up-converter according to the present disclosure

FIG. 1 shows a first aspect of the base band to radio frequency up-converter 1 according to the present disclosure. The base band to radio frequency up-converter 1 may form a part of a transmitter for a mobile communication system that transmits a radio frequency signal that is modulated onto a carrier signal, whereby the carrier signal has a carrier frequency $f_{Carrier}$. The base band to radio frequency up-converter 1 comprises a phase converter 2, a first all-pass delay filter 41, a second all-pass delay filter 42, a third all-pass delay filter 43, a first delta sigma modulator 51, a second delta sigma modulator 52, a third delta sigma modulator 53, and a multiplexer 6.

The phase converter 2 comprises a first input 201 for receiving I-samples of an in-phase signal I and a second input 202 for receiving Q-samples of a quadrature signal Q. The I-samples and the Q-samples each have bit length of sixteen bits and represent values of between −1 and +1. The I-sample and the Q-sample each are received at the first input 201 and the second input 202 at a clock rate that typically is lower than the frequency of the transmitter carrier signal $f_{Carrier}$. The I-sample and the Q-sample comprise the amplitude information and the phase information for the amplitude and phase modulation of the transmitter carrier signal.

The phase converter 2 calculates for each pair of the I-sample and the Q-sample a triplet comprising a first intermediate sample X, a second intermediate sample Y, and a third intermediate sample Z. The second intermediate sample Y is 120° apart in phase to the first intermediate sample X, and the third intermediate sample Z is 240° apart in phase from the first intermediate sample. The phase converter 2 ensures that the triplet of the first intermediate sample X, the second intermediate sample Y, and the third intermediate sample Z preserves the phase information and the amplitude information of each pair of the I-sample and the Q-sample. For this purpose the phase converter 2 comprises a first multiplier 21, a second multiplier 22, a third multiplier 23, a fourth multiplier 24, a fifth multiplier 25, a first adder 26, and a second adder 27.

As the first intermediate sample X, the second intermediate sample Y, and the third intermediate sample Z each are always calculated for a fixed phase angle of 0°, 120° or 240°, the first multiplier 21, the second multiplier 22, the third multiplier 23, the fourth multiplier 24, and the fifth multiplier 25 can be implemented as multiplying circuits which multiply the received I-sample and the received Q-sample with a constant value. The first multiplier 21 converts the incoming I-sample to a cos(0°) value and so this conversion corresponds to a multiplication by 1.000. Basically the incoming I-sample can be passed on unchanged. The second conversion by cos(120°) in the second multiplier 22 corresponds to a multiplication by a factor of substantially −0.500 and the fourth phase conversion in the fourth multiplier 24 by cos(240°) corresponds to a multiplication by a factor of substantially −0.500. Similarly the third phase conversion of the incoming Q-sample in the third multiplier by sin(120°) corresponds to a multiplication by a factor of substantially 0.866, and the fifth phase conversion by sin(240°) corresponds to a multiplication by a factor of substantially 0.866.

A first multiplier input 211 is connected to the first input 201 and therefore receives only the incoming I-samples. The first multiplier 21 converts each of the incoming I-samples received at the first multiplier input 211 by multiplying the incoming I-sample by a value of cos(0°) providing a first multiplier output sample I·cos(0°) at a first multiplier output 212. A second multiplier input 221 is also connected to the first input 201 and therefore also receives only the incoming I-samples. The second phase converter 22 converts each of the incoming I-sample received at the second phase converter input 221 by multiplying the I-sample with a value of cos (120°) providing a second phase converter output sample I·cos (120°) at a second phase converter output 222. A third phase converter input 231 is connected to the second input 202 and therefore receives only Q-samples. The third multiplier 23 converts each of the incoming Q-samples received at the third multiplier input 231 by multiplying the incoming Q-sample with a value of sin(120°) providing a third multiplier output sample Q·sin(120°) at a third multiplier output 232. A fourth multiplier input 241 is connected to the first input 201 and therefore receives only the incoming I-samples. The fourth multiplier 24 converts each of the incoming I-sample received at the fourth multiplier input 241 by multiplying the incoming I-sample with a value of cos(240°) providing a fourth multiplier output sample I·cos(240°) at a fourth multiplier output 242. A fifth multiplier input 251 is connected to the second input 202 and therefore receives only Q-samples. The fifth multiplier 25 converts each Q-sample received at the fifth multiplier input 251 by multiplying the incoming Q-sample with a value of sin(240°) providing a fifth multiplier output sample Q·sin(240°) at a fifth multiplier output 252.

The first multiplier output sample is directly used as a first intermediate sample $X_n$ provided at a first phase converter output 291 The second multiplier sample and the third multiplier sample are passed to a first adder 26 in order to provide a second intermediate sample $Y_n$ at a second phase converter output 292. The third multiplier sample and the fifth multiplier sample are passed to a second adder 27 to provide a third intermediate sample $Z_n$ at a third phase converter output 293. The first intermediate sample $X_n$, the second intermediate sample $Y_n$ and the third intermediate sample $Z_n$ hereby correspond to the I-samples and the Q-samples as follows:

$X_n = \cos(0°) \cdot I + \sin(0°) \cdot Q = I$ $Y_n = \cos(120°) \cdot I + \sin(120°) \cdot Q = -0.500 \cdot I + 0.866 \cdot Q$ $Z_n = \cos(240°) \cdot I + \sin(240°) \cdot Q = -0.500 \cdot I - 0.866 \cdot Q$ As the date rate of the first intermediate sample $X_n$, the second intermediate sample $Y_n$ and the third intermediate sample $Z_n$ is lower than the frequency of the carrier frequency $f_{carrier}$. A sample rate converter device 3 inserts subsamples to adapt the data rate of the first intermediate sample $X_n$, the second intermediate sample $Y_n$ and the third intermediate sample $Z_n$ to the carrier frequency $f_{carrier}$. A well-known technique in the art for generating additional subsamples is just to repeat the samples an appropriate number of times. In this aspect of the present disclosure the sample rate converter device 3 comprises a first sample rate converter 31 for first intermediate samples $X_n$, a second sample rate converter 32 for the second intermediate samples $Y_n$ and a third sample rate converter 33 for the third intermediate samples $Z_n$. The first sample rate converter 31 is connected with a first sample rate converter input to the first phase converter output 291; the second sample rate converter 32 is connected with a second sample rate converter input to the second phase converter output 292; and the third sample rate converter 33 is connected with a third sample rate converter input to the third phase converter output 293. A first sample rate converter output of the first sample rate converter 31 is connected to a first filter input of a first all-pass delay filter 41; a second sample rate converter output of the second sample rate converter 32 is connected to a second filter input of a second all-pass delay filter 42; and a third sample rate converter output of the third sample rate converter 33 is connected to a third filter input of a third all-pass delay filter 43.

The person skilled in the art will readily appreciate that the sample rate converter device 3 can be placed in different places and the placement between the phase converter 2 and the first all-pass delay filter 41; the second all-pass delay filter 42, and the all-pass delay filter 43, respectively is a mere example. The sample rate converter device 3 may be placed for example before the phase converter device 2 or for example in between the first all-pass delay filter 41; the second all-pass delay filter 42, and the all-pass delay filter 43 and the first delta sigma modulator 51, the second delta sigma modulator 52 and the third delta sigma modulator 53.

The first delta sigma modulator 51, the second delta sigma modulator 52 and the third delta sigma modulator 53 are low pass delta sigma modulators which are clocked with a clock rate $f_{CLCK}$ that corresponds to a third of the transmitter carrier signal $f_{Carrier}$. The first intermediate sample $X_n$ is filtered in the first all-pass delay filter 41 and then passed to the first delta sigma delta modulator 51. The second intermediate sample $Y_n$ is filtered in the second all-pass delay filter 42 and delayed by one clock cycle T of the delta sigma modulator clock rate $f_{CLCK}$ and then passed to the second delta sigma delta modulator 52. The third intermediate sample $Z_n$ is filtered in the third all-pass delay filter 43 delayed by two clock cycles 2T of the delta sigma modulator clock rate $f_{CLCK}$ and then passed to the third delta sigma delta modulator 53.

The first delta sigma modulator 51 generates a first DSM output sample $A_n$ provided at a first delta-sigma modulator output, the second delta sigma modulator 52 generates a second DSM output sample $B_n$ provided at a second delta-sigma modulator output, and the third delta sigma modulator 53 generates a third DSM output sample $C_n$ provided at a third delta-sigma modulator output. Thus each of the first intermediate sample $X_n$, the second intermediate sample $Y_n$ and the third intermediate sample $Z_n$ is converted from a low-speed, high resolution signal to a high-speed baseband signal represented by the first DSM output sample $A_n$, the second DSM output sample $B_n$, and the third DSM output sample $C_n$. The first DSM output sample $A_n$, the second DSM output sample $B_n$, and the third DSM output sample $C_n$ are up-converted by the 3:1 multiplexer 6. The multiplexer 6 generates an output signal with alternating samples of the first DSM output sample $A_n$, the second DSM output sample $B_n$, and the third DSM output sample $C_n$: $A_n$, $B_n$, $C_n$, $A_{n+1}$, $B_{n+1}$, $C_{n+1}$, $A_{n+2}$, $B_{n+2}$, $C_{n+2}$, . . . .

The up-sampling of the first DSM output sample $A_n$, the second DSM output sample $B_n$, and the third DSM output sample $C_n$ creates an alias at one third of the carrier frequency $f_{Carrier}$, so that in contrast to 4:1 modes or 4:3 modes no further up-conversion is required.

Compared to 4:3 modes with two delta sigma modulators the clock frequency is 1.5 times higher. This allows for a 1.5 times larger bandwidth of the noise notch.

An aspect of the present disclosure is that in an existing design for a transceiver based on an existing chip set, whereat least the up-converter in 4:3 mode and the power transmitter adopted to 4:3 mode are distributed in different chips, only the chip with the up-converter has to be redesigned. The chip with the power transmitter adapted to 4:3 mode usually still can be left unchanged. The proposed up-converter in 3:1 mode automatically generates NRZ (non return to zero coding) such as a 4:1 mode up-converter would do. The sample frequency in the proposed 3:1 mode is increased only by a factor of 9:8 compared to 4:3 mode, which usually will be still within the speed specification of the power transmitter chip.

Figure 2:
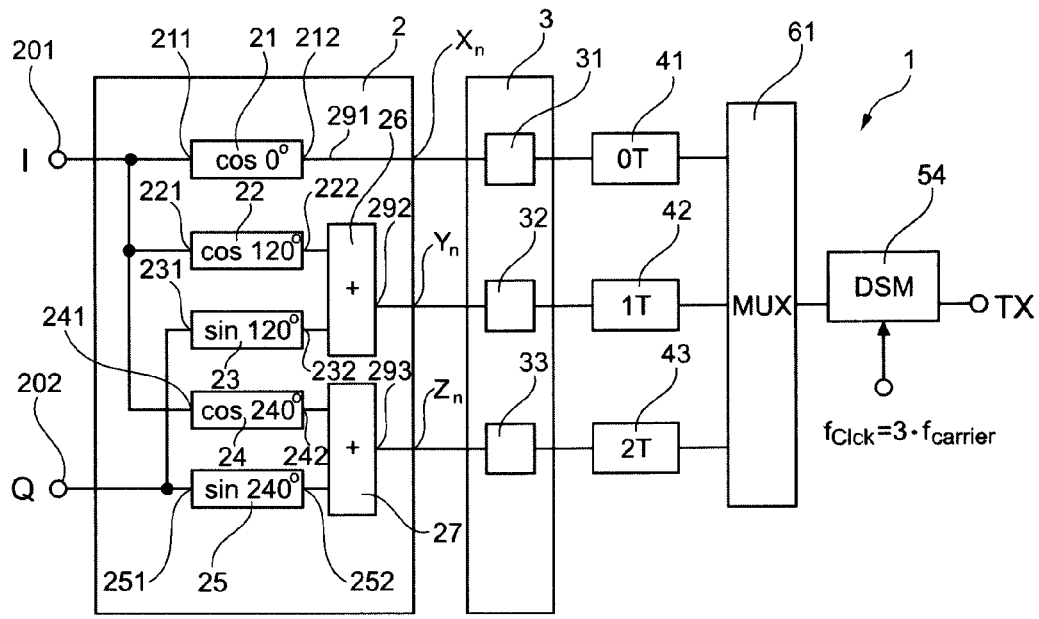
FIG. 2 shows a further aspect of the base-band to radio frequency up-converter according to the present disclosure

FIG. 2 shows another aspect of the present disclosure. The base band to frequency up-converter 1 is similar to the base-band to frequency up-converter shown in FIG. 1 and the same reference numbers are used as in FIG. 1 for identical objects. Instead of a first delta sigma modulator, a second delta sigma modulator and a third delta sigma modulator the output samples of the first all-pass delay filter 41, the second all-pass delay filter 42 and the third all-pass delay filter 43 are passed to a multiplexer 61 first. The output samples of the multiplexer 61 are then passed to a single delta sigma modulator 54. However, in this aspect of the present disclosure the single delta sigma modulator has to be clocked at three times the full carrier frequency $f_{carrier}$.

Figure 3:
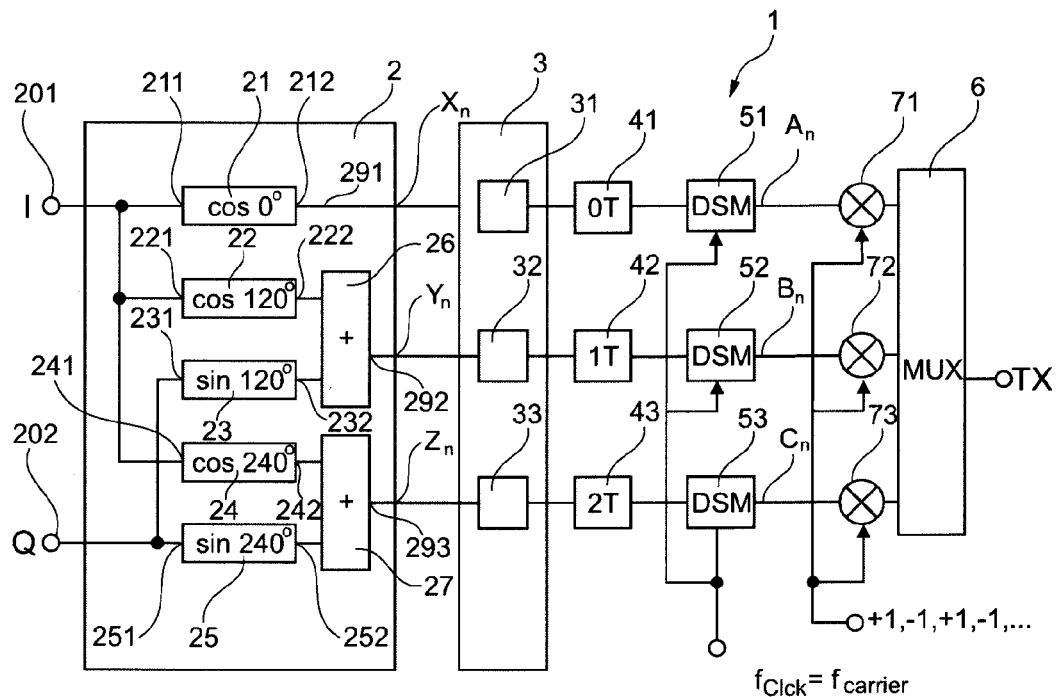
FIG. 3 shows a further aspect of the base-band to radio frequency up-converter according to the present disclosure

FIG. 3 shows another aspect of the present disclosure. The base band to frequency up-converter 1 is similar to the base-band to frequency up-converter shown in FIG. 1 and the same reference numbers are used as in FIG. 1 for identical objects. Instead of being connected to the first multiplexer input the first delta-sigma modulator output is connected to a first mode extension switch signal input of a first mode extension switch 71. A first mode extension switch output is connected to the first multiplexer input. Similarly the second delta-sigma modulator output is connected to a second mode extension switch signal input of a second mode extension switch 72. A second mode extension switch output is connected to the second multiplexer input. Finally the third delta-sigma modulator output is connected to a third mode extension switch signal input of a third mode extension switch 73. A third mode extension switch output is connected to the third multiplexer input. The first mode extension switch 71 comprises a first mode extension sequence signal input for receiving a mode extension sequence signal. The second mode extension switch 72 comprises a second mode extension sequence signal input for receiving the mode extension sequence, and the third mode extension switch 73 comprises a third mode extension sequence signal input for receiving the mode extension sequence signal.

In the present disclosure the first mode extension switch 71 is a sixth multiplier, the second mode extension switch 72 is a seventh multiplier, and the third mode extension switch 73 is an eight multiplier. The mode extension sequence is a number sequence consisting of alternating values of +1, −1. By multiplying the output samples of the first delta sigma modulator 51, the second delta sigma modulator 52 and the third delta sigma modulator 53 with the switching sequence +1, −1, +1, −1, . . . the following sequence is provided at the output of the multiplexer 6:

$A_n$, $B_n$, $C_n$, $-A_{n+1}$, $-B_{n+1}$, $-C_{n+1}$, $A_{n+2}$, $B_{n+2}$, $C_{n+2}$, $-A_{n+3}$ . . . .

Thus the mode extension sequence enables in a very simple way a 6:1 mode.

Figure 4:
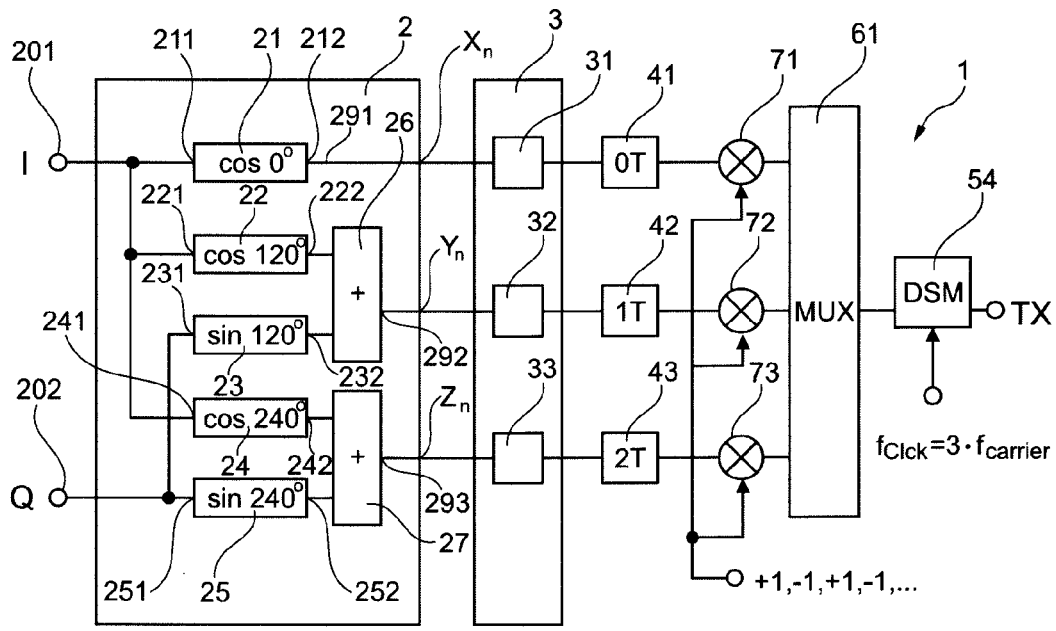
FIG. 4 shows a further aspect of the base-band to radio frequency up-converter according to the present disclosure

FIG. 4 shows another aspect of the present disclosure. The base band to frequency up-converter 1 is similar to the base-band to frequency up-converter shown in FIG. 2, and the same reference numbers are used as in FIG. 1 for identical objects. The first mode extension switch input of the first mode extension switch 71 is connected to the first filter output of the first all-pass delay filter 41. The first mode extension switch output is connected to the first multiplexer input 62. The second mode extension switch input of the second all-pass delay filter 42 is connected to the second mode extension switch input and the second mode extension switch output is connected to the second multiplexer input. The third mode extension switch input of the third mode extension switch is connected to the third all-pass delay filter 43 and the third mode extension switch output is connected to the third multiplexer output.

In the event the mode extension sequence consists completely of values +1 the generated samples $A_n$, $B_n$, $C_n$, $A_{n+1}$, $B_{n+1}$, $C_{n+1}$ . . . correspond to the samples in 3:1 mode. By means of a not shown mode switch which selects the appropriate switching sequence and the appropriate clock frequency for the one delta sigma modulator or the parallel delta-sigma modulators respectively the up-converter can be easily switched between 3:1 mode and 6:1 mode.

Figure 5:
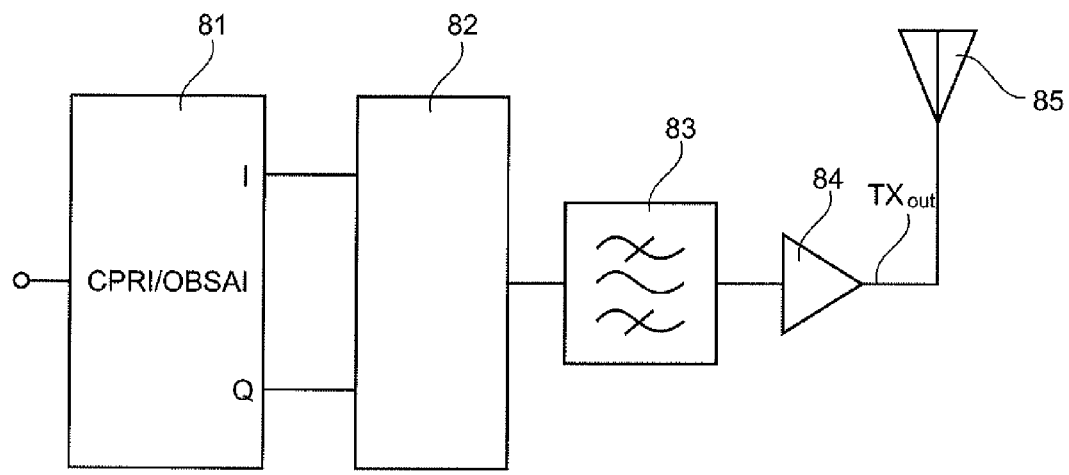
FIG. 5 shows an application of a base-band to radio frequency up-converter according to the present disclosure in an active antenna system

FIG. 5 shows as another aspect of the present disclosure the use of the base-band to radio frequency up-converter in a radio station. The radio station may for example be part of an antenna array system for the mobile communications network. As this aspect of the present disclosure relates only to the transmitting part of the radio station, only the transmitting part is shown, although the person skilled in the art will appreciate that the radio station for the mobile communications network will also include circuit arrangements for receiving the radio signal. For reasons of clarity only the most essential components are presented in FIG. 5. In the context of this disclosure the radio station is part but is not limited to a base transceiver station, as known from GSM networks, as well as a node B (known from UMTS/3G networks) or enhanced node B, and similar units used in other mobile communication network.

A base band signal, which comprises encoded data, e.g. encoded voice data, is received via a CPRI/OBSAI interface 81 as I-samples and Q-samples. The I-samples and Q-samples are passed to a base band to radio frequency up-converter 82, which corresponds to the up-converter 1 described in FIG. 1, FIG. 2, FIG. 3 and FIG. 4 above. The radio frequency samples TX of the base band to radio frequency up-converter 82 are passed through a band pass filter 83 to a linear power amplifier 84. The linear power amplifier 84 amplifies the radio signal and passes the amplified radio signal $TX_{out}$ to an antenna 85.

Figure 6:
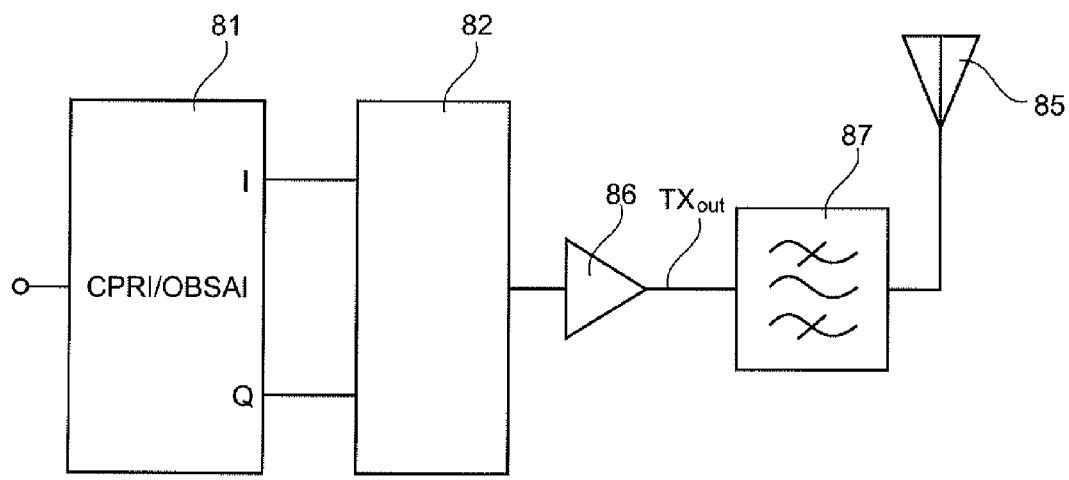
FIG. 6 shows another application of a base-band to radio frequency up-converter according to the present disclosure in an active antenna system.

In another aspect of the present disclosure depicted in FIG. 6 the up-converted radio signal is amplified by a switching amplifier 86 The output signal of the delta-sigma modulators 31, 32, 33 or the delta-sigma modulator 34 is digital and thus the switching amplifier 86 can be operated highly effectively. An amplifier output signal $TX_{out}$ of the switching amplifier 86 is passed through a power band pass filter 87 to an antenna 85.

The present disclosure further relates to a computer program product embedded on a computer readable medium. The computer program product comprises executable instructions for the manufacture of the delta sigma modulator of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CO-ROM, OVO-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A base-band to radio frequency up-converter comprising a first input for receiving a first base band signal, having phase and amplitude information, of first base band samples and a second input for receiving a second base band signal, having phase and amplitude information, of second base band samples and an output for providing up-converted radio signal samples, the base-band to radio frequency up-converter further comprising:
  a phase converter for converting the first base band signal of first base band samples and the second base band signal of second base band samples into at least two of a first intermediate signal of first intermediate samples, a second intermediate signal of second intermediate samples, and a third intermediate signal of third intermediate samples, wherein the phase converter provides the at least two of the first intermediate samples, the second intermediate samples, and the third intermediate samples as substantially equidistant subsamples of the first base band signal and the second base band signal,
  at least one delta sigma modulator for converting the at least two of the first intermediate signal of first intermediate samples, the second intermediate signal of second intermediate samples, and the third intermediate signal of third intermediate samples into the up-converted radio signal samples,
wherein
  the first intermediate samples correspond substantially to the first base band signal;
  the second intermediate samples correspond substantially to the sum of the product of cos(120°) times the first base band sample and the product of sin(120°) times the second base band sample; and
  the third intermediate samples correspond substantially to the sum of the product of cos(240°) times the first base band signal and the product of sin(240°) times the second base band signal.

2. The base-band to radio frequency up-converter according to claim 1, wherein the at least two of the first intermediate samples, the second intermediate samples, and the third intermediate samples of the phase converter are passed to a mode extension switch for modifying the value of the at least two of the first intermediate samples into first modified samples, the second intermediate samples into second modified samples, and the third intermediate samples into third modified samples.

3. The base-band to radio frequency up-converter according to claim 2, wherein the mode extension switch alternating inverts the value of one of the first intermediate samples, the second intermediate samples, and the third intermediate samples.

4. The base-band to radio frequency up-converter according to claim 1, wherein the at least two of the first intermediate samples, the second intermediate samples, and the third intermediate samples of the phase converter are passed to a multiplexer for multiplexing into at least one multiplexed signal that is passed to the at least one delta sigma modulator.

5. The base-band to radio frequency up-converter according to claim 1, wherein at least one of the first intermediate signal of first intermediate samples is passed to first delta sigma modulator, the second intermediate signal of second intermediate samples is passed to a second delta sigma modulator, and the third intermediate signal of third intermediate samples is passed to a third sigma delta modulator.

6. The base-band to radio frequency up-converter according to claim 2, whereby at least two of the first modified samples, the second modified samples, and the third modified samples are passed to a multiplexer for interleaving at least two of the first modified samples, the second modified samples, and the third modified samples into the radio signal samples.

7. The base-band to radio frequency up-converter according to claim 2, further comprising a mode switch for switching between a first clock frequency and at least a second clock frequency supplied to the at least a first delta-sigma modulator and for switching between a first signal modifying sequence and at least a second signal modifying sequence supplied to the mode extension switch for modifying the first intermediate samples, the second intermediate samples, and the third intermediate samples of the phase converter.

8. The base band to radio frequency up-converter according to claim 2, wherein the clock frequency of the at least one delta sigma modulator corresponds substantially to one of three times or six times the frequency of a transmitter carrier signal.

9. The base band to radio frequency up-converter according to claim 3, wherein the clock frequency of at least one of the first delta sigma modulator, the second delta sigma modulator, and the third delta sigma modulator corresponds substantially to one of a frequency of a transmitter carrier signal or twice a frequency of the transmitter carrier signal.

10. The base band to radio frequency up-converter according to claim 1, wherein one of the first base band signal and second base band signal or the first intermediate sample, the second intermediate sampled and the third intermediate sample are up-sampled.

11. The base-band to radio frequency up-converter according to claim 1, wherein the phase converter is enabled to by-pass the first base band signal and the second base band signal.

12. A method for up-converting a first base band signal, having phase and amplitude information, of first base band samples and a second base band signal, having phase and amplitude information, of second base band samples into radio signal samples comprising:
  sample rate conversion of the first base band signal of first base band samples and the second base band signal of second base band samples into at least two of a first intermediate signal of first intermediate samples, a second intermediate signal of second intermediate samples, and a third intermediate signal of third intermediate samples, wherein the phase converter provides the at least two of the first intermediate samples, the second intermediate samples, and the third intermediate samples as substantially equidistant subsamples of the first base band signal and the second base band signal;
  converting at least one of the at least two of the first intermediate signal of first intermediate samples, the second intermediate signal of second intermediate samples, and the third intermediate signal of third intermediate samples into the radio signal samples,
wherein
  the first intermediate samples correspond substantially to the first base band signal;
  the second intermediate samples correspond substantially to the sum of the product of cos(120°) times the first base band sample and the product of) sin(120°) times the second base band sample; and
  the third intermediate samples correspond substantially to the sum of the product of cos(240°) times the first base band signal and the product of sin(240°) times the second base band signal.

13. An active antenna array comprising a base band to frequency up-converter, the base band to frequency up-converter comprising a first input for receiving a first base band signal, having phase and amplitude information, of first base band samples and a second input for receiving a second base band signal of second base band samples, having phase and amplitude information, and an output for providing up-converted radio signal samples, the base-band to radio frequency up-converter further comprising:
  a phase converter for converting the first base band signal of first base band samples and the second base band signal of second base band samples into a first intermediate signal of first intermediate samples, a second intermediate signal of second intermediate samples, and a third intermediate signal of third intermediate samples, wherein the phase converter provides the at least two of the first intermediate samples the second intermediate samples, and the third intermediate samples as substantially equidistant subsamples of the first base band signal and the second base band signal, and
  at least one delta sigma modulator for converting the first intermediate signal of first intermediate samples, the second intermediate signal of second intermediate samples, and the third intermediate signal of third intermediate samples into the radio signal samples,
wherein
  the first intermediate samples correspond substantially to the first base band signal;
  the second intermediate samples correspond substantially to the sum of the product of cos(120°) times the first base band sample and the product of sin(120°) times the second base band sample; and
  the third intermediate samples correspond substantially to the sum of the product of cos(240°) times the first base band signal and the product of sin(240°) times the second base band signal.

* * * * *